US008766709B2

(12) United States Patent
Kim

(10) Patent No.: US 8,766,709 B2
(45) Date of Patent: Jul. 1, 2014

(54) SEMICONDUCTOR INTEGRATED CIRCUIT

(75) Inventor: Young Tae Kim, San Ramon, CA (US)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 13/598,980

(22) Filed: Aug. 30, 2012

(65) Prior Publication Data

US 2014/0062584 A1   Mar. 6, 2014

(51) Int. Cl.
*G05F 1/10*   (2006.01)
(52) U.S. Cl.
USPC ............ 327/540; 327/541; 327/543; 327/143
(58) Field of Classification Search
USPC ......... 327/541, 530, 536, 537, 538, 540, 542, 327/543, 544, 545, 546, 560, 561, 562, 563, 327/77, 78, 79, 87, 88, 89, 143, 198, 390, 327/589
See application file for complete search history.

(56) References Cited

U.S. PATENT DOCUMENTS

| | | | | |
|---|---|---|---|---|
| 5,162,668 A * | 11/1992 | Chen et al. | ..................... | 327/541 |
| 6,018,264 A * | 1/2000 | Jin | ................. | 327/536 |
| 6,091,282 A * | 7/2000 | Kim | .............................. | 327/536 |
| 8,130,028 B2 * | 3/2012 | Park et al. | ..................... | 327/536 |

* cited by examiner

*Primary Examiner* — Lincoln Donovan
*Assistant Examiner* — Jung H Kim
(74) *Attorney, Agent, or Firm* — Finnegan, Henderson, Farabow, Garrett & Dunner, LLP

(57) ABSTRACT

A semiconductor integrated circuit includes a first internal voltage generator including a PMOS and a first comparator, and a second internal voltage generator including an NMOS, a second comparator, and a voltage pump generator configured to provide a pumping power voltage to the second comparator. A power control circuit switchably enables an output from the first internal voltage generator during a power-on of the semiconductor integrated circuit and enables an output from the second internal voltage generator after the power-on.

8 Claims, 5 Drawing Sheets

SEMICONDUCTOR INTEGRATED CIRCUIT

FIELD OF THE DISCLOSURE

The present disclosure relates generally to integrated circuits and, more particularly, to circuitry for generating an internal voltage in an integrated circuit.

BACKGROUND

Nearly every electronic device today contains some sort of memory, or electronic storage media, for storing data. This memory is typically implemented in hardware using addressable semiconductors, i.e., integrated circuits consisting of transistors. There are many different types of memory used in modern electronics, including, but not limited to, RAM, ROM, Flash, and EEPROM.

Elements in semiconductor integrated circuit devices have been miniaturized more and more as the degree of integration of the devices has increased. As sizes of MOS transistors (insulated gate type field effect transistors) decrease, thicknesses of gate insulating films decrease, and thicknesses of interlayer insulating films between interconnections also decrease. Therefore, if an external supply voltage having a conventional value of, for example, 5 volts is used as an operation supply voltage, dielectric breakdown may occur, impairing the reliability of the integrated circuit device. Therefore, in a semiconductor integrated circuit device such as a semiconductor memory device that is utilized in a system operating with a conventional supply voltage value of 5 volts, the external supply voltage is stepped down or is subjected to voltage down conversion to generate an internal voltage. The internal voltage then is utilized within the system as an operation supply voltage.

An internal voltage generator, which may down-convert for generating the internal voltage, is designed such that the internal voltage generated by the internal voltage generator can maintain a level of a predetermined constant voltage value, even if the external supply voltage becomes higher than the constant voltage value. An operation for maintaining an internal voltage at a constant voltage value is referred to as an "internal step-down" or a "voltage down conversion." Such internal voltage generators are usually provided in semiconductor memory devices such as DRAMs (dynamic random access memories) and SRAMs (static random access memories). The reason for this is that logic LSIs (large-scale integrated circuit devices), such as microprocessors which determine system power supplies, have not been highly miniaturized as compared with semiconductor memory devices, and a voltage of 5 volts is still used as the system supply voltage. The purpose for the step-down is to ensure the reliability of the internal circuits of the integrated circuit device and to reduce the consumption of current. The power consumption is generally proportional to the square of the voltage. Therefore, a lower operation supply voltage enables lower power consumption.

SUMMARY OF THE INVENTION

According to an embodiment of the present disclosure, there is provided a semiconductor integrated circuit, comprising: a first internal voltage generator including a PMOS and a first comparator, the PMOS to receive a first voltage source and to output a first voltage generator output, a gate of the PMOS coupled to receive a first driving voltage from an output of the first comparator; a second internal voltage generator including an NMOS, a second comparator, and a voltage pump generator to provide a pumping power voltage to the second comparator, the NMOS to receive a second voltage source and to output a second voltage generator output, a gate of the NMOS coupled to receive a second driving voltage from an output of the second comparator; and a power control circuit configured to switchably enable the first voltage generator output from the first internal voltage generator during a power-on of the semiconductor integrated circuit or to enable the second voltage generator output from the second internal voltage generator after the power-on.

According to another embodiment of the present disclosure, there is provided a method for generating an internal voltage in semiconductor integrated circuit, comprising: providing a first voltage to a PMOS of a first internal voltage generator; providing a second voltage to an NMOS of a second internal voltage generator; providing a third voltage as a first power supply to a first comparator in the first internal voltage generator; providing a pumping power voltage as a second power supply to a second comparator in the second internal voltage generator; and switchably enabling a first voltage generator output from the first internal voltage generator by applying a first driving voltage equal to the first power supply from the first comparator of the first internal voltage generator to a gate of the PMOS during a power-on of the semiconductor integrated circuit or enabling a second voltage generator output from the second internal voltage generator after the power-on by applying a second driving voltage equal to the second power supply from the second comparator of the second voltage generator to a gate of the NMOS.

Additional features and advantages of the invention will be set forth in part in the description that follows, and in part will be obvious from the description, or may be learned by practice of the invention. The features and advantages of the invention will be realized and attained by means of the elements and combinations particularly pointed out in the appended claims.

It is to be understood that both the foregoing general description and the following detailed description are exemplary and explanatory only, and are not restrictive of the invention, as claimed.

BRIEF DESCRIPTION OF THE DRAWINGS

The accompanying drawings, which are incorporated in and constitute a part of this specification, illustrate multiple embodiments and, together with the description, serve to explain the principles of the embodiments.

DESCRIPTION OF THE EMBODIMENTS

Reference will now be made in detail to the exemplary embodiments, which are illustrated in the accompanying drawings. Wherever possible, the same reference numbers will be used throughout the drawings to refer to the same or like parts.

For the purpose of explanation, each embodiment described below is implemented in a four-bit pre-fetched Low Power Double Data Rate 2 (LPDDR2) synchronous dynamic random access memory (SDRAM) device. Those of skill in the art will recognize that embodiments consistent with the disclosure may also be readily implemented in various memory devices of varying configurations. For example, embodiments consistent with the disclosure may also be implemented in DDR3, MDDR3, and any other memory using a 4-bit pre-fetch, 8-bit pre-fetch, or any other pre-fetch memory device.

Throughout the specification, various components in the figures are illustrated as being coupled to ground "GND". Ground as used herein refers to a reference point in an electric circuit from which other voltage are measured, or is a common return path for electric current, or a direct physical connection to Earth, in accordance with conventional practices.

Figure 1:
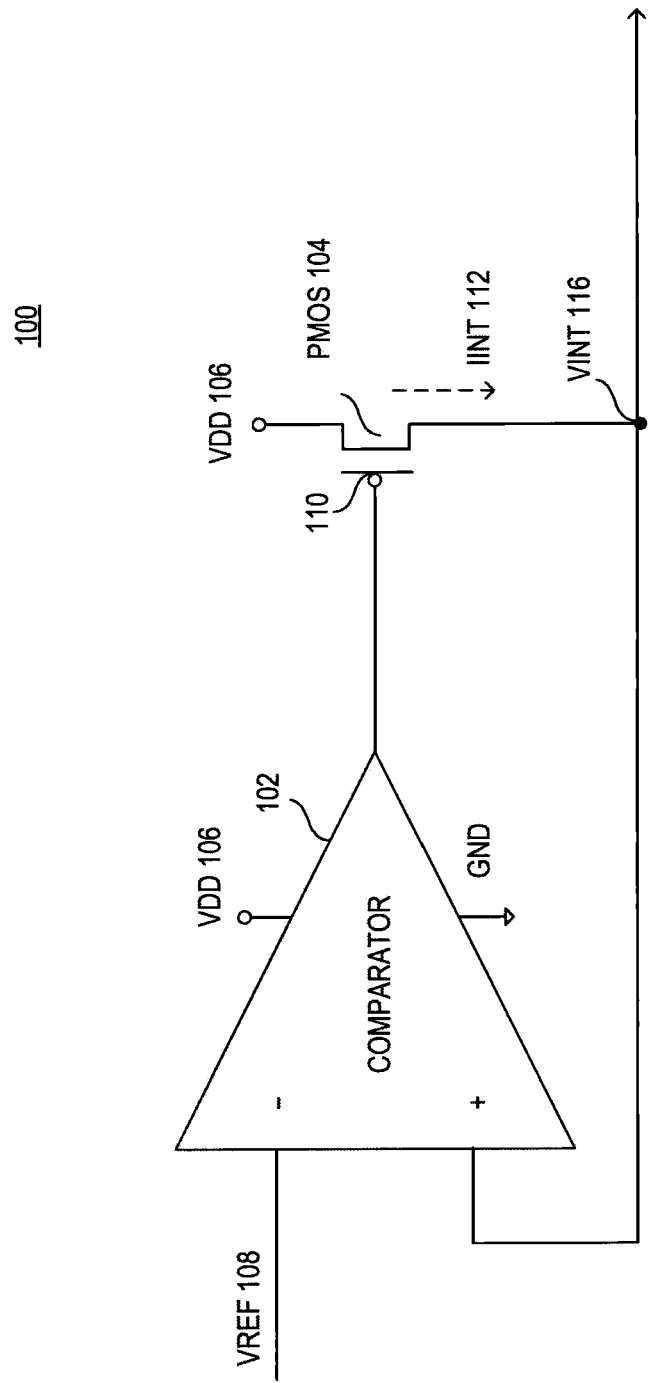
FIG. 1 is a circuit diagram of a conventional internal voltage generator.

FIG. 1 illustrates a circuit diagram of a conventional internal voltage generator. Referring to FIG. 1, an internal voltage generator 100 includes a comparator 102 coupled to a PMOS 104. A first power supply (not shown) provides an external voltage VDD 106 to both comparator 102 and PMOS 104. The first power supply can be variable. Comparator 102 is provided with a reference voltage VREF 108 and an internal voltage VINT 116 is fed back to comparator 102. In comparator 102, if VREF 108 is not equal to VINT 116, comparator 102 drives a gate 110 of PMOS 104. In response to gate 110 of PMOS 104 being driven by comparator 102, an internal current IINT 112 is produced and the internal resistance of PMOS 104 results in generation of VINT 116. VREF 108 is a fixed voltage provided to comparator 102. The configuration of internal voltage generator 100 that includes PMOS 104 is utilized when the difference between VDD 106 and VINT 116 is large, for example, more than 0.3 V. Accordingly, PMOS 104 provides IINT 112 which, due to the internal resistance of PMOS 104, results in the generation of VINT 116.

Figure 2:
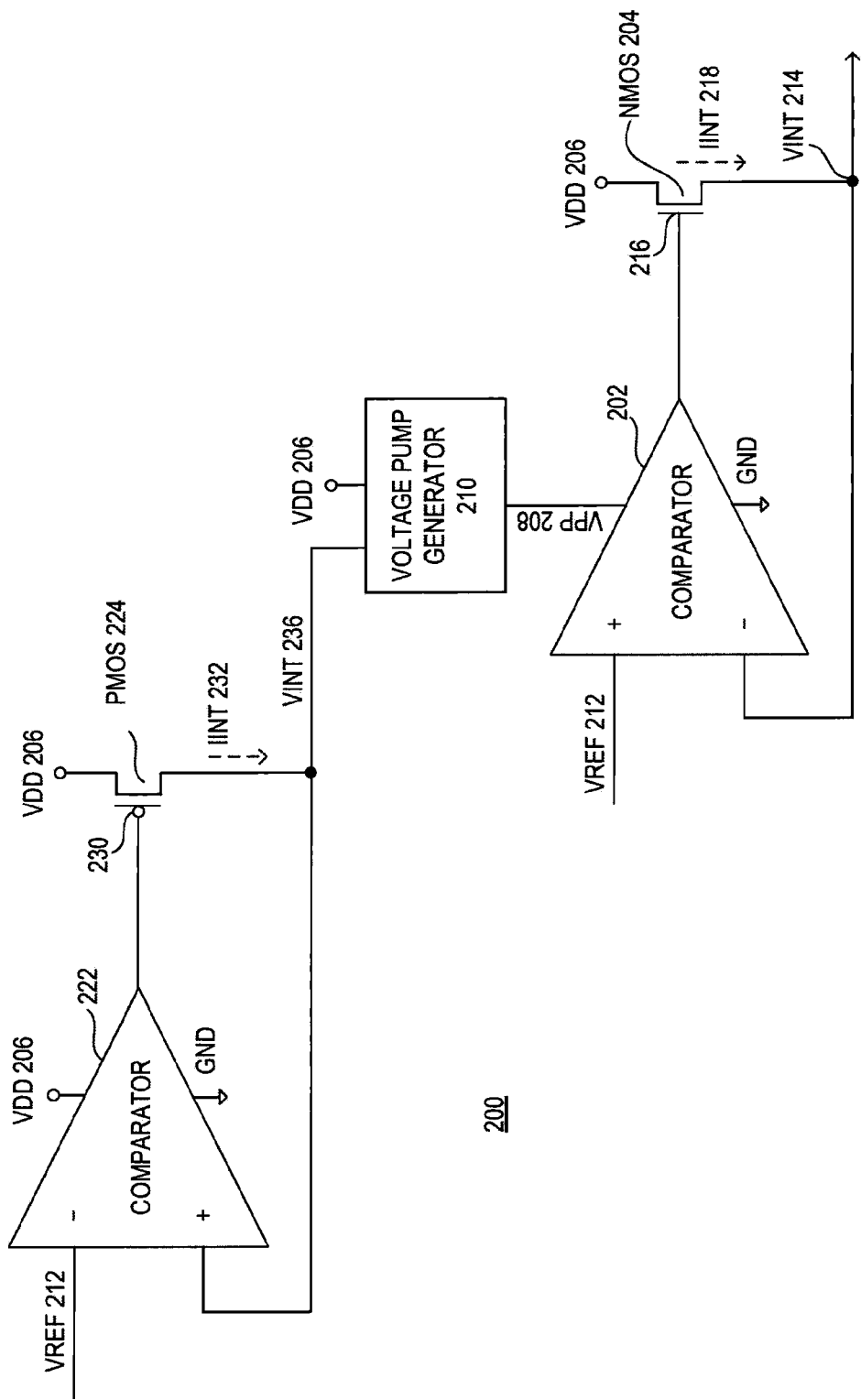
FIG. 2 is a circuit diagram of another conventional internal voltage generator.

FIG. 2 illustrates a circuit diagram of another conventional internal voltage generator. Referring to FIG. 2, an internal voltage generator 200 includes a comparator 202 coupled to an NMOS 204. A first power supply (not shown) provides an external voltage VDD 206 to NMOS 204. Furthermore, a pumped voltage VPP 208 from a voltage pump generator 210 is provided to comparator 202. The first power supply can be variable. A reference voltage VREF 212 is provided to comparator 202, and a first internal voltage VINT 214 is fed back to comparator 202. In comparator 202, if VREF 212 is not equal to VINT 214, comparator 202 drives a gate 216 of NMOS 204. In response to gate 216 of NMOS 204 being driven, an internal current IINT 218 is produced and the internal resistance of NMOS 204 results in the generation of VINT 214. Reference voltage VREF 212 is a fixed voltage provided to the comparator 202.

Internal voltage generator 200 also includes a comparator 222 coupled to a PMOS 224. A first power supply provides external voltage VDD 206 to both comparator 222 and PMOS 224. Reference voltage VREF 212 is also provided to comparator 222. In response to a gate 230 of PMOS 224 being driven, an internal current IINT 232 is provided to a load 234, leading to the generation of a second internal voltage VINT 236. VINT 236 is fed back to comparator 222 and provided to voltage pump generator 210. In comparator 222, if VREF 212 is not equal to VINT 236, comparator 222 drives gate 230 of PMOS 224 to produce internal current IINT 232 that, in turn, causes generation of VINT 236 due to the internal resistance of the PMOS 224. Voltage pump generator 210 receives VDD 206 and VINT 236, and produces VPP 208. Voltage pump generator 210 utilizes both VDD 206 and VINT 236 with VINT 236 being used for the oscillation stage of a voltage pump generator 210 and VDD 206 being used at the final pumping stage to produce VPP 208.

The NMOS based configuration for an internal voltage generator is utilized when the difference between VDD 206 and VINT 214 is small, for example, less than 0.3 V. Accordingly, NMOS 204 provides IINT 218 to generate VINT 214.

Figure 3:
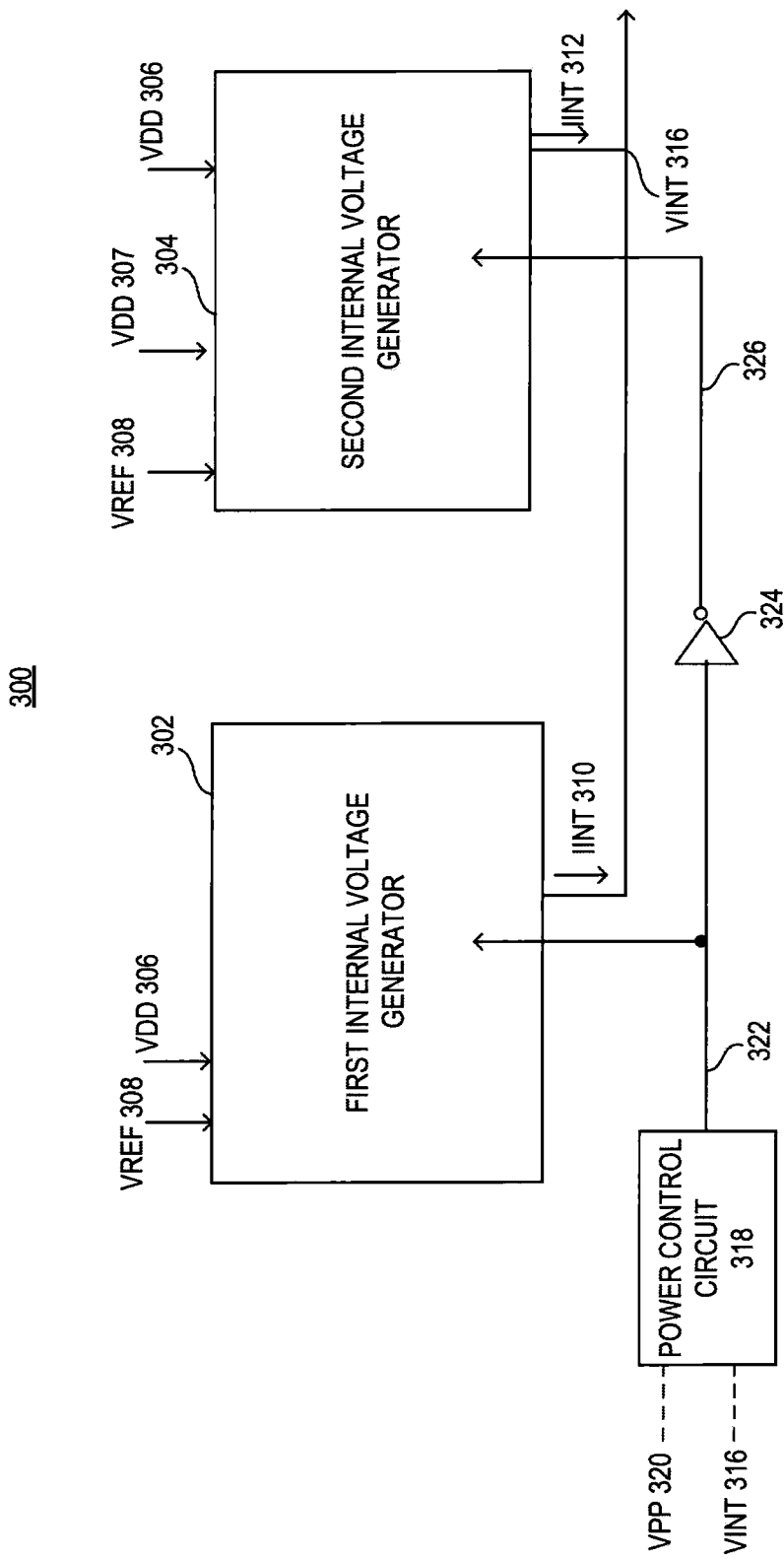
FIG. 3 is a block diagram of a semiconductor integrated circuit, according to an exemplary embodiment.

FIG. 3 illustrates a semiconductor integrated circuit 300, in accordance with an embodiment of the present disclosure. Circuit 300 includes a first internal voltage generator 302 and a second internal voltage generator 304. A first power supply (not shown) provides a first external voltage VDD 306 to both first internal voltage generator 302 and second internal voltage generator 304. A second power supply (not shown) provides a second external voltage VDD 307 to only second internal voltage generator 304. A reference voltage VREF 308 is also provided to both first and second internal voltage generators 302 and 304. First internal voltage generator 302, when enabled, outputs a first internal current IINT 310, and second internal voltage generator 304, when enabled, outputs a second internal current IINT 312. The internal resistance of a respective PMOS (not illustrated) within first voltage generator 302 and the internal resistance of a respective NMOS (not illustrated) within second voltage generator 304, and the respective first and second internal currents IINT 310 and 312, result in the generation of internal voltage VINT 316.

VINT 316 is fed back to a power control circuit 318 along with a pumping voltage VPP 320. Based on VPP 320 and VINT 316, power control circuit 318 provides a power-on output 322. Power-on output 322 is provided directly to first internal voltage generator 302. Power-on output 322 is also provided to an inverter 324, which provides an inverted output 326 to second internal voltage generator 304. Accordingly, based on the value of the power-on output 322, only one of the first internal voltage generator 302 or the second internal voltage generator 304 is enabled to output a corresponding first IINT 310 or second IINT 312, respectively. Accordingly, power control circuit 318 is configured to switchably enable first internal voltage generator 302 to output first internal current IINT 310 or second internal voltage generator 304 to output second internal current IINT 312, to cause generation of VINT 316.

Figure 4:
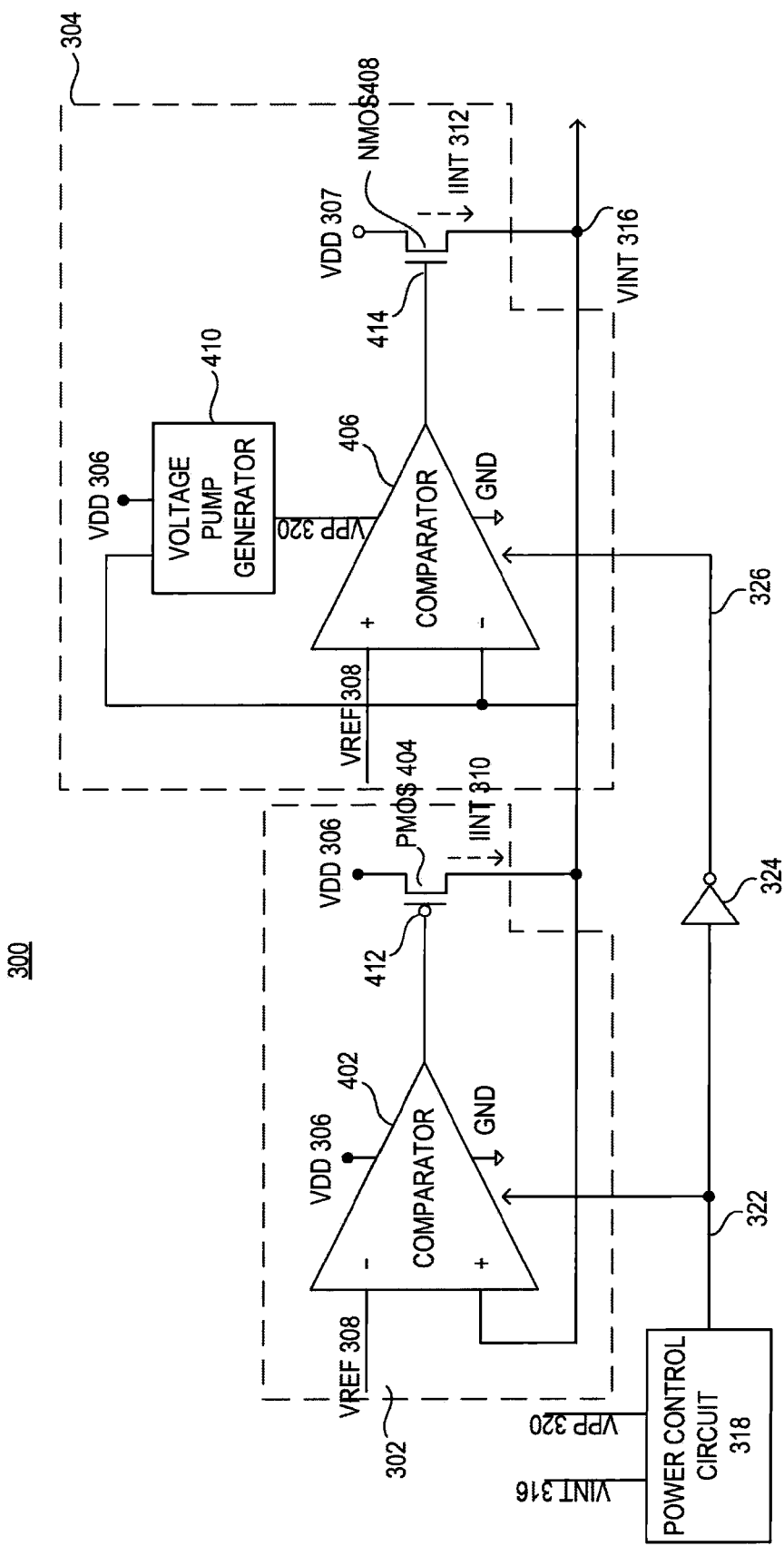
FIG. 4 is a circuit diagram of a semiconductor integrated circuit, according to an exemplary embodiment.

FIG. 4 illustrates an exemplary construction of semiconductor integrated circuit 300, including a comparator 402 coupled to a PMOS 404 within first internal voltage generator 302, and a comparator 406 coupled to an NMOS 408 within second internal voltage generator 304. A first power supply (not shown) provides first external voltage VDD 306 to comparator 402, PMOS 404, and a voltage pump generator 410 in second internal voltage generator 304. A second power supply (not shown) provides second external voltage VDD 307 to only NMOS 408 in second voltage generator 304. Reference voltage VREF 308 is also provided to comparators 402 and 406. VREF 308 is a fixed voltage. VINT 316 is also fed back to both comparators 402 and 406.

Voltage pump generator 410 receives VDD 306 as well as VINT 316, and utilizes capacitors (not illustrated) as energy storage elements to generate VPP 320. Voltage pump generator 410 can step-up or lower a voltage from voltage sources, that is, VPP 320 may be a higher or lower voltage than VDD 306 and VINT 316. A high level of VPP 320 which can be efficiently generated based on VDD 306 and VINT 316 can be utilized to provide enough power to comparator 406, so that comparator 406 drives a gate 414 of NMOS 408 by outputting the comparator 406's voltage source, VPP 320. The high level of VPP 320 is utilized. Since the voltage difference between the drain and source of NMOS 408 is small, a higher voltage should be applied to gate 414 of NMOS 408 to produce internal current IINT 312.

VINT 316 is also fed back to comparator 402, comparator 406, and power control circuit 318. VINT 316 is provided to a non-inverting input (+) of comparator 402 and an inverting input (−) of comparator 406. VREF 308, on the other hand, is provided to an inverting input (−) of comparator 402 and a non-inverting input (+) of comparator 406. As is conventionally known, in comparators, when the non-inverting input (+) is at a higher voltage level than the inverting input (−), the high gain of the comparator (operational amplifier) causes the output of the comparator to saturate at the highest positive voltage it can output. When the non-inverting input (+) is at a lower voltage level than the inverting input (−), the output saturates at the most negative voltage the comparator can output. Here, for comparator 402, when a value of VINT 316 provided to the non-inverting input (+) is higher than VREF 308, it results in PMOS 404 reducing the value of current IINT 310 to reduce the value of VINT 316 to a level that is equal to VREF 308. Conversely, for comparator 406, when the value of VINT 316 provided to the inverting input (−) is less than VREF 308, it results in NMOS 408 increasing the value of current IINT 312 to increase the value of VINT 316 to a level that is equal to VREF 308. Power control circuit 318 also receives VPP 320. Based on VPP 320 and VINT 316, power control circuit 318 provides power-on output 322. Power-on output 322 is provided directly to comparator 402 in first internal voltage generator 302. Power-on output 322 is also provided to inverter 324, which provides inverted output 326 to comparator 406 in second internal voltage generator 304. Accordingly, based on the value of the power-on output 322, only one of comparators 402 and 406 is enabled.

When comparator 402 is enabled, if VREF 308 is not equal to VINT 316, comparator 402 drives a gate 412 of PMOS 404. In response to gate 412 of PMOS 404 being driven, current IINT 310 is produced, and the internal resistance of PMOS 404 results in the generation of internal voltage VINT 316. Alternatively, when comparator 406 is enabled, if VREF 308 is not equal to VINT 316, comparator 406 drives a gate 414 of NMOS 408. In response to gate 414 of NMOS 408 being driven, internal current IINT 312 is produced, and the internal resistance of NMOS 408 results in the generation of internal voltage VINT 316. Accordingly, either of currents IINT 310 or IINT 312 can generate VINT 316 based on the internal resistance of PMOS 404 or NMOS 408. Accordingly, power control circuit 318 is configured to switchably enable first internal voltage generator 302 or second internal voltage generator 304 to cause current IINT 310 or IINT 312, respectively, to flow, to cause generation of VINT 316.

In one embodiment, the level of VDD 306 provided to PMOS 404 is higher than the level of VDD 307 provided to NMOS 408.

In another embodiment, the level of VDD 306 and VDD 307 is the same. In an additional embodiment, a power supply provides the same external voltage VDD to both PMOS 404 and NMOS 408 of FIG. 4.

Figure 5:
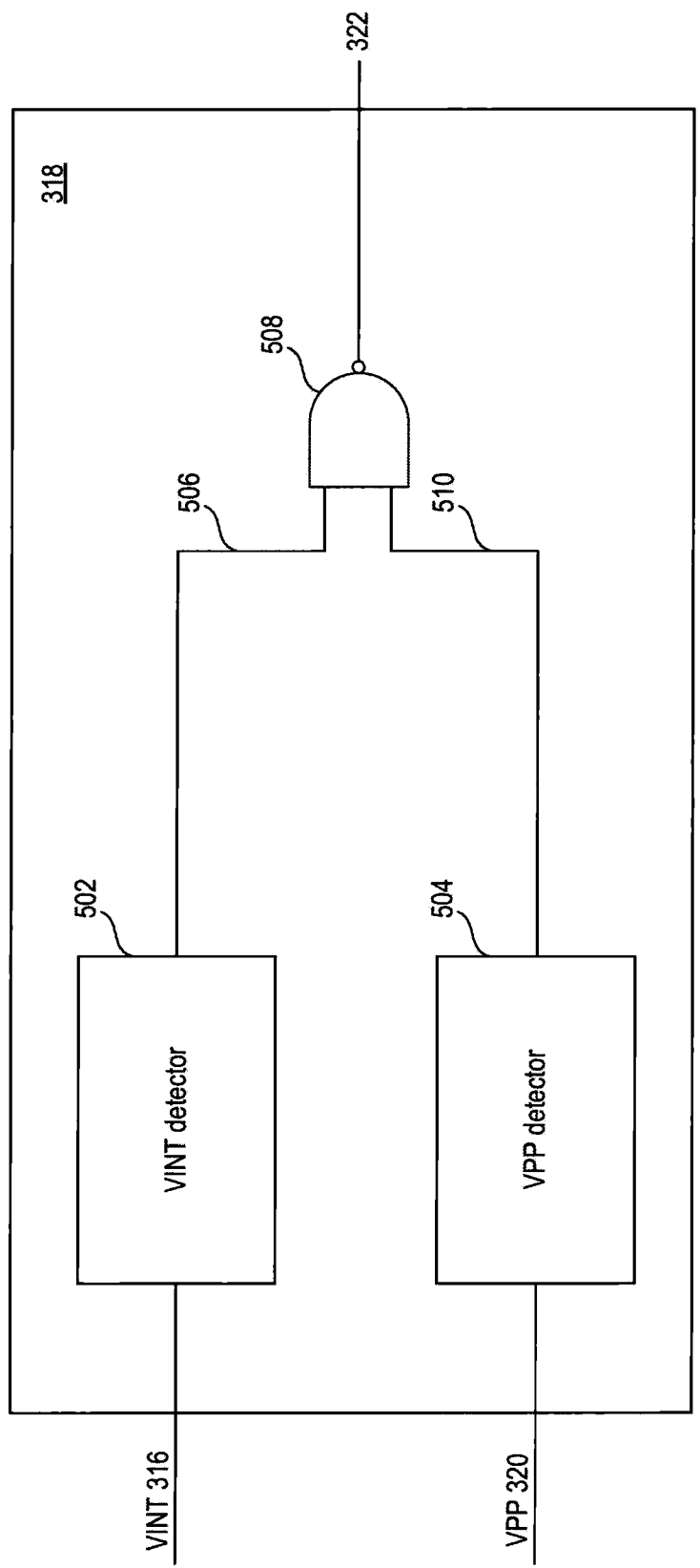
FIG. 5 is a circuit diagram of a power control circuit, according to an exemplary embodiment.

FIG. 5 illustrates an exemplary construction of power control circuit 318, which includes an internal voltage VINT detector 502 and a pumped voltage VPP detector 504. VINT detector 502 receives VINT 316 and provides a stepped-down voltage 506 to a NAND gate 508. Similarly, VPP detector 504 receives VPP 320 and provides a stepped-down voltage 510 to NAND gate 508. VINT detector 502 and VPP detector 504 utilize conventional voltage step-down or voltage-lowering circuitry to produce stepped-down voltages 506 and 510 that are received by NAND gate 508. Stepped-down voltages 506 and 510 are stepped to a level that is compatible with the logic voltage level of NAND gate 510.

Accordingly, due to the logic operation of NAND gate 508, first internal generator 302 will be enabled during a power-on stage. This is due to the fact that even if either of VINT 316 and VPP 320 have low values (the stepped-down versions of which are input into NAND gate 508), output 322 will be "1," which enables and turns on first internal voltage generator 302 while providing a "0" or disabling value to second internal voltage generator 304. For example, during power-on, first voltage generator 302 initially provides VINT 316 which may have a low level, which may be represented as "0" to the NAND gate 508. According to NAND gate logic, any "0" input leads to a "1" output. However, once a device is powered on and provides high values of VINT 316 and VPP 320, which are stepped down to be provided to NAND gate 508, then output 322 will be "0." Accordingly, first internal voltage generator 302 will be disabled, and second internal voltage generator 304, which receives inverted output 326, which would be "1," is enabled.

Accordingly, during the turning on of integrated circuit 300, initially VINT 316 has a zero "0" value and VPP 320 that is partially dependent on VINT 316 that is fed to voltage generator pump 410 also has of a zero "0" value. According to NAND logic, if any of the inputs provided to a NAND gate are "0", the output is "1". Accordingly, when "0" values are provided for stepped-down voltages 506 and 510 to NAND gate 508, output 322 is "1" which enables comparator 402. However, after integrated circuit 300 is turned on, VINT 316 has a high value. VINT 316 being fed back to voltage generator pump 410 leads to a high generated value for VPP 320. Accordingly, two high values ("1s") are provided to NAND gate 508 from stepped-down voltages 506 and 510 resulting in output 322 having a value of "0". As a result, comparator 402 is disabled and comparator 406 is enabled based on inverted output 326 which is "1". As a result, once integrated circuit 300 is turned on as represented by high values of VINT 316 and VPP 320, first internal voltage generator 302 is disabled and second internal voltage generator 304 is enabled. This leads to power consumption efficiency, as a higher level of power is needed to be provided to a PMOS to drive enough current to generate an internal voltage while less power can be utilized to maintain that internal voltage utilizing an NMOS.

It will be apparent to those skilled in the art that various modifications and variations can be made to the structure disclosed without departing from the scope or spirit of the invention. In view of the foregoing, it is intended that the present invention covers modifications and variations of this invention, provided they fall within the scope of the following claims and their equivalents.

What is claimed is:

1. A semiconductor integrated circuit, comprising:
a first internal voltage generator including a PMOS and a first comparator, the PMOS to receive a first voltage source and to output a first voltage generator output, a gate of the PMOS coupled to receive a first driving voltage from an output of the first comparator;
a second internal voltage generator including an NMOS, a second comparator, and a voltage pump generator to provide a pumping power voltage to the second comparator, the NMOS to receive a second voltage source and to output a second voltage generator output, a gate of the NMOS coupled to receive a second driving voltage from an output of the second comparator; and
a power control circuit configured to switchably enable the first voltage generator output from the first internal voltage generator during a power-on of the semiconductor integrated circuit or to enable the second voltage generator output from the second internal voltage generator after the power-on.

2. The semiconductor integrated circuit of claim 1, wherein the first voltage source provides a higher voltage level than the second voltage source.

3. The semiconductor integrated circuit of claim 1, wherein:
the power control circuit is configured to switchably enable the first or the second voltage generator output by respectively enabling the first or second comparator.

4. The semiconductor integrated circuit of claim 1, wherein the power control circuit is configured to switchably enable the first or the second voltage generator output based on the pumping power voltage and an internal voltage based on the first and the second voltage generator outputs.

5. A method for generating an internal voltage in a semiconductor integrated circuit, comprising:
providing a first voltage to a PMOS of a first internal voltage generator;
providing a second voltage to an NMOS of a second internal voltage generator;
providing a third voltage as a first power supply to a first comparator in the first internal voltage generator;
providing a pumping power voltage as a second power supply to a second comparator in the second internal voltage generator; and
switchably enabling a first voltage generator output from the first internal voltage generator by applying a first driving voltage equal to the first power supply from the first comparator of the first internal voltage generator to a gate of the PMOS during a power-on of the semiconductor integrated circuit or enabling a second voltage generator output from the second internal voltage generator after the power-on by applying a second driving voltage equal to the second power supply from the second comparator of the second voltage generator to a gate of the NMOS.

6. The method of claim 5, further comprising:
providing the first voltage at a higher voltage level than the second voltage.

7. The method of claim 5, wherein:
the switchably enabling comprises switchably enabling the first voltage generator output or the second voltage generator output by respectively enabling the first or the second comparator.

8. The method of claim 6, wherein:
the switchably enabling comprises switchably enabling the first voltage generator output or the second voltage generator output based on the pumping power voltage and an internal voltage that are based on the first and the second voltage generator outputs.

* * * * *